United States Patent [19]

Kleinsasser et al.

[11] Patent Number: 5,019,530
[45] Date of Patent: May 28, 1991

[54] METHOD OF MAKING METAL-INSULATOR-METAL JUNCTION STRUCTURES WITH ADJUSTABLE BARRIER HEIGHTS

[75] Inventors: Alan W. Kleinsasser, Putnam Valley; Jerry M. Woodall, Bedford, both of N.Y.

[73] Assignee: International Business Machines Corporation, Armonk, N.Y.

[21] Appl. No.: 512,245

[22] Filed: Apr. 20, 1990

[51] Int. Cl.$^5$ .............................................. H01L 29/56
[52] U.S. Cl. .................................. 437/175; 437/176; 437/177; 437/178; 437/179; 357/6; 357/7; 357/15; 148/DIG. 139; 148/DIG. 140; 148/DIG. 142
[58] Field of Search ............... 437/175, 176, 177, 178, 437/179; 357/6, 7, 15; 148/DIG. 139, DIG. 140, DIG. 142

[56] References Cited

U.S. PATENT DOCUMENTS

| | | | |
|---|---|---|---|
| 3,056,073 | 9/1962 | Mead | 317/234 |
| 3,448,350 | 6/1969 | Yamashita et al. | 317/234 |
| 3,702,956 | 11/1972 | Benard et al. | 317/234 |
| 3,938,243 | 2/1976 | Rosvold | 148/DIG. 139 |
| 4,107,724 | 8/1978 | Ralph | 357/7 |
| 4,163,677 | 8/1979 | Carlson et al. | 357/15 |
| 4,220,959 | 9/1980 | Kroger | 357/5 |
| 4,371,884 | 2/1983 | Esaki et al. | 357/12 |
| 4,377,031 | 3/1983 | Goto et al. | 437/175 |
| 4,421,577 | 12/1983 | Spicer | 437/176 |
| 4,449,140 | 5/1984 | Board | 357/7 |
| 4,490,733 | 12/1984 | Kroger | 357/5 |
| 4,638,342 | 1/1987 | Freeouf et al. | 357/15 |
| 4,763,176 | 8/1988 | Ito | 357/15 |
| 4,946,803 | 8/1990 | Ellwenger | 437/177 |

OTHER PUBLICATIONS

"Polycrystalline Semiconductor Solar Cell", IBM TDB vol. 17, #8 Jan. 1975 p. 2455.
"Control of Silicon Content in Schottky Barrier Diode Metallurgy", Giddings et al., IBM Tech. Discl. Bul. vol. 16 No. 2 Jul. 73 pp. 615-616.
"Minority Carrier Confinement Thin Film Solar Cell",
Hovel et al., IBM Tech. Discl. Bul. vol. 18 No. 2 Jul. 75 pp. 544-545.
"Metal-InAs Contact for Vertical Heterojunction Transistors", Jackson et al. IBM Tech. Discl. Bul. vol. 29 No. 5 Oct. 86 pp. 2235-2236.

(List continued on next page.)

Primary Examiner—Olik Chaudhuri
Assistant Examiner—Gordon V. Hugo
Attorney, Agent, or Firm—John J. Goodwin

[57] ABSTRACT

A method and structures are described for fabricating junctions having metal electrodes separated by polycrystalline barriers with arbitrarily-chosen but controlled barrier height and shape is accomplished by varying the composition and doping of polycrystalline multinary compound semiconductor materials in the barrier, hence varying the Fermi level pinning position such that the Fermi level is fixed and controlled at and everywhere in between the two metal-insulator interfaces. It is known that Schottky barrier heights at metal/compound semiconductor interfaces are determined by a Fermi level pinning mechanism rather than by the electronic properties of the applied metallurgy. The present invention exploits the knowledge that the same type of Fermi level pinning occurs at semiconductor dislocations and grain boundaries. The present invention uses polycrystalline compound semiconductor alloys in which the pinning position is varied over a large range in metal/semiconductor structures. The structures are composed of sandwiches of metal, compound semiconductor and metal. Tunneling currents are determined by barrier height, controlled by semiconductor alloy composition, and semiconductor thickness. The energy barrier in the polycrystalline material can be uniform throughout, due to the uniformity of pinning position at both the metal/semiconductor interface and the grain boundaries.

8 Claims, 5 Drawing Sheets

OTHER PUBLICATIONS

"Cryogenic Tunneling Transistor", Kleinsasser et al., *IBM Tech. Discl. Bul.* vol. 29 No. 5 Oct. 86 pp. 2244–2245.

"Graded Base Heterostructure Hot Electron Transistor", Jackson et al., *IBM Tech. Discl. Bul.* vol. 29 No. 5 Oct. 86 p. 2283.

"Reach-Through Contact for Heterojunction Structures" Jackson et al., *IBM Tech. Discl. Bul.* vol. 29 No. 5 Oct. 86 pp. 2299–2301.

"Pseudomorphic Heterostructure Three-Terminal Devices", Jackson et al., *IBM Tech. Discl. Bul.* vol. 29 No. 8 Jan. 87 p. 3662.

"Ternary Semiconductor Superconducting Device", Brady et al., *IBM Tech. Discl. Bul.* vol. 29 No. 10 Mar. 87 pp. 4534–4536.

"Recessed Lateral Double-Heterojunction Bipolar Junction Transistor" vol. 30 No. 6 Nov. 87 pp. 412–413. *IBM Tech. Discl. Bul.* C. Harder et al.

"Preparing Thermally Stable Ohmic Contacts for Gallium Arsenide Semiconductor Devices", Braslau et al., *IBM Tech. Discl. Bul.* vol. 31 No. 2 Jul. 88 pp. 383–384.

"Reducing the Effective Height of a Schottky Barrier Using Low-Energy Ion Implantation", J. M. Shannon. *Appl. Phys. Lett.* vol. 24, No. 8, 15 Apr. 1974, pp. 369–371.

"Barrier Height Control of $Pd_2$ Si/Si Schottky Diodes Using Diffusion From Doped Pd", B. Studer, *Solid-State Electronics* vol. 23, pp. 1181–1184.

"Absence of Fermi Level Pinning at Metal-$In_xGa_{1-x}As$ (100) Interfaces", L. J. Brillson et al., Appl. Phys. Lett. 48(21), 26 May 1986, p. 1458.

METHOD OF MAKING METAL-INSULATOR-METAL JUNCTION STRUCTURES WITH ADJUSTABLE BARRIER HEIGHTS

BACKGROUND OF THE INVENTION

1. Field of the Invention

The present invention relates to the fabrication of semiconductor junction devices, and more particularly, to a method of fabricating a metal-insulator-metal junction having barrier heights adjustable by the composition of the insulator layer.

2. DESCRIPTION OF THE PRIOR ART

The references listed herein are cited because they discuss technical areas such as tunneling, Fermi levels, barriers and techniques for varying their heights and metal-semiconductor-metal junctions.

The references are cited as background art, and do not relate to Fermi level pinning at metal-polycrystalline-metal interfaces and at grain boundaries for controlling the height and shape of barriers.

U.S. Pat. No. 3,056,073 issued Sept. 25, 1986 to Mead entitled SOLID-STATE ELECTRON DEVICES describes a tunnel diode structure wherein two metal plates with an applied electric field are separated by an insulating layer and electrons as one metal plate near the Fermi level tunnel through the conduction band of the insulator into the other metal plate.

U.S. Pat. No. 3,448,350 issued June 3, 1969 to Yamashita et al entitled SEMICONDUCTOR COMPRISING PLURAL DEEP-LEVEL-FORMING IMPURITIES describes a semiconductor device comprising a body of semiconductor material such as a III-V compound, Si or Ge doped with at least two deep-level-forming impurities. At least two electrodes are provided to the semiconductor body. The body may have additional regions of p, n, p+ and n+ conductivity formed therein.

U.S. Pat. No. 3,702,956 issued Nov. 14, 1972 to Renard et al entitled JOSEPHSON JUNCTIONS relates to a Josephson type junction constituted by a layer of semiconductor material inserted between two superconductors. The superconductors are chosen such that the Fermi level of these superconductors falls at the location of the contact with the semiconductor material externally of the forbidden gap of the said semiconductor. Junctions according to the invention may be used in high frequency current applications when a D.C. voltage is applied.

U.S. Pat. No. 4,220,959 issued Sept. 2, 1980 to Kroger, entitled JOSEPHSON TUNNEL JUNCTION WITH POLYCRYSTALLINE SILICON, GERMANIUM OR SILICON-GERMANIUM ALLOY TUNNELING BARRIER, describes a structure wherein a Josephson tunnel junction device having niobium nitride superconductive electrodes includes a polycrystalline semiconductor tunneling barrier therebetween comprised of silicon, germanium or an alloy thereof preferably deposited on the lower superconductive electrodes by chemical vapor deposition. The barrier height of the junction is precisely controlled by precision doping of the semiconductor material.

U.S. Pat. No. 4,371,884 issued Feb. 1, 1983 to Esaki et al, entitled INAS-GASB TUNNEL DIODE, discloses a tunnel diode consisting of an accumulation region of p-type GaSb and an accumulation region of n-type InAs separated by a thin layer of a quaternary compound consisting of InGaSbAs. Such a diode structure converts the interface between the two accumulation regions of p-type and n-type material from what would normally be an ohmic junction into a tunneling junction. Such a tunnel diode requires no heavy doping which is normally required for a tunnel diode.

U.S. Pat. No. 4,449,140, issued May 15, 1984 to Board, entitled SEMICONDUCTOR BARRIER SWITCHING DEVICES, discloses two and three terminal semiconductor barrier switching devices in which a semiconductor junction or a Schottky barrier is used to inject carriers towards a barrier formed by a narrow layer having the same dopant type. In the non-conducting state, the barrier prevents conduction but as an applied bias is increased, the barrier begins to allow carriers of the opposite type to pass releasing the first mentioned carriers and causing the barrier height to be reduced. This action becomes regenerative with increasing bias and after passing through a negative resistance region, the device enters its conducting state. When the third terminal is present, the device is made conducting by biasing its third terminal to cause carriers of the first mentioned type to be injected into the barrier region, for example, from a diffusion adjacent to the third terminal.

U.S. Pat. No. 4,490,733, issued Dec. 25, 1984 to Kroger, entitled JOSEPHSON DEVICE WITH TUNNELING BARRIER HAVING LOW DENSITY OF LOCALIZED STATES AND ENHANCED FIGURES OF MERIT, describes a superconducting tunnel junction device having superconductive electrodes which has a non-homogeneous barrier layer of amorphous semiconducting material with a reduced density of localized states in the central region of the barrier so as to minimize leakage currents, resulting in improved current-voltage characteristics approximating an ideal tunnel junction device. In a preferred embodiment, superconductive electrodes of niobium are conjoined with a tri-layer barrier using pure silicon adjoining the electrodes and a core hydrogenated amorphous silicon.

U.S. Pat. No. 4,763,176, issued Aug. 9, 1988 to Ito entitled METAL-SEMICONDUCTOR-METAL SCHOTTKY PHOTODIODE, describes a metal-semiconductor-metal photodiode comprising a semiconductor layer and a cathode electrode and an anode electrode which are formed on the semiconductor layer and are made of such mutually different electrode materials that the cathode electrode has a Schottky barrier height $\Phi_{bn}$ from a conduction band satisfying $\Phi_{bn} > Eg/2$ and the anode electrode has a Schottky barrier height $\Phi_{bp}$ from a valence band satisfying $\Phi_{bp} > Eg/2$, where Eg denotes the energy band gap.

IBM Technical Disclosure Bulletin, Vol. 16, No. 2, July 1973, page 615, describes a Schottky barrier diode in which the level of the silicon incorporated therein has an effect on the barrier heights.

IBM Technical Disclosure Bulletin, Vol. 18, No. 2, July 1975, page 544, describes a thin film device having increased efficiency which consists of an inexpensive substrate made of aluminum, tungsten, steel, glass and the like. On top of the substrate is a thin film of a semiconductor such as GaP, ZnS, GaN, $Al_{1-x}Ga_xP$, and the like. This "intermediate semiconductor layer" should have a relatively good lattice constant match to silicon.

On top of the semiconductor layer is placed a thin layer of polycrystalline silicon. The thickness of the silicon film is of the order of 10 microns. The conductivity type of the silicon and the semiconductor layer on the substrate are of the same type, that is, they are either both N type or they are both P type.

IBM Technical Disclosure Bulletin, Vol 29, No. 5, October 1986, page 2235 discloses a transistor consisting of an InGaAs base sandwiched between two GaAs layers which serve as emitter and collector. A metal on the edge of the structure forms a Schottky barrier and the barrier height to the InGaAs layer decreases with increasing In fraction to the point where the barrier height to the metal goes to zero.

IBM Technical Disclosure Bulletin, Vol. 29, No. 5, October 1986 at page 2244, shows a metal-insulator-metal structure wherein control of the current through the InGaAs insulator is achieved through gate control of the barrier material. The Schottky barrier height of the polycrystalline $In_xGa_{1-x}As$ material varies with the composition difference between the Schottky barrier and the metal.

IBM Technical Disclosure Bulletin, Vol 29, No. 5, October 1986 at page 2283 describes a hot electron-type transistor structure constructed with a semiconductor (e.g., nGaAs) for the emitter and collector, and with an epitaxial n++ semiconductor with a smaller band gap (e.g., InGaAs) for the base layer. This will minimize base losses associated with scattering at the metal/semiconductor (base/collector) interface. Further, the emitter/base barrier is made larger than the base/collector barrier to improve the current gain. This is accomplished by grading the In concentration in the ternary semiconductor base layer. The energy bands for the case of a GaAs/InGaAs/GaAs device are shown in which a larger In fraction at the emitter/base interface than at the collector/base interface results in a higher emitter/base barrier. The composition is thus graded so that the In concentration decreases across the base from emitter to collector.

IBM Technical Disclosure Bulletin, Vol. 29, No. 5, October 1986 at page 2299, describes a contact formed using an alloy of a metal with a small percentage of an impurity ingredient. When the alloy is fused with semiconductor material of the heterojunction structure, the metal forms an alloy with one ingredient thereof and the impurity diffuses in snowplow fashion into the heterojunction structure.

When a thin film of Pd-Mg is deposited on GaAs and heated to 500° C., it is converted to PdGa. The Mg diffuses/snowplows into GaAs at the interface, producing a p+ doped layer of GaAs. The use of this material in contacting thin active device layers is illustrated for the three cases: (1) heterojunction hot electron ("metal base") transistor base contact, (2) heterojunction bipolar transistor base contact, and (3) contact to a Modulation Doped Field-Effect Transistor (MODFET) 2D electron gas.

IBM Technical Disclosure Bulletin, Vol. 29, No. 8, January 1987 at page 3662, discloses the use of lattice-matched epitaxial heterostructures in semiconductor devices. Pseudomorphic heterostructures are fabricated with barrier heights which are controlled by composition according to the electron affinity rule.

IBM Technical Disclosure Bulletin, Vol. 29, No. 10, March 1987 at page 4534 describes the use of a ternary alloy of InGaAs ($In_{1-x}Ga_xAs$) for a collector isolator and the insulation of the surface thereof with a p-n junction to provide the ability to control the barrier height at the base interface while providing general insulation.

IBM Technical Disclosure Bulletin, Vol. 30, No. 6, November 1987 at page 412, discloses a lateral double-heterojunction bipolar junction transistor structure designed for GaAs technology.

The device is fabricated as outlined below:

On a semi-insulating GaAs (Si GaAs) substrate, the following layers are subsequently grown using Molecular Beam Epitaxy (MBE):

p+GaInAs (100 nm thick; doping level: $10^{19}$ $cm^{-3}$), n Al GaAs (50 nm; $10^{18} cm^{-3}$), n+GaInAs (50 nm; $10^{19} cm^{-3}$).

The latter layer serves to provide good ohmic contacts. It is a variable composition layer, starting at the bottom as n GaAs and gradually changing to n+ InAs at the top.

IBM Technical Disclosure Bulletin, Vol. 31, No. 2, July 1988 at page 383 describes a technique whereby ohmic contacts are prepared so as to produce thermally-stable low-resistance contacts. Two preparation methods are described: Indium-Germanium coevaporation and implantation of indium through the contact metals.

Ohmic behavior in the contact material is believed to be due to a reduction of the barrier height, by ternary InGaAs phases, which exist at the metal/GaAs interfaces.

The publication, "Reducing the effective height of a Schottky barrier using low-energy ion implantation" by J. M. Shannon, Applied Physics Letters, Vol. 24, No. 8, Apr. 15, 1974 at page 369 reports that a thin highly doped layer at the surface of a semiconductor has been used to increase the surface field of a Schottky barrier and reduce the barrier height by an amount insensitive to applied bias. The effective barrier height of Ni-Si barriers of this type made using ion-implantation techniques has been reduced by an amount in the range 0–0.2 eV without significant degradation of the reverse characteristic.

The publication "BARRIER HEIGHT CONTROL OF $PD_2Si$/Si SCHOTTKY DIODES USING DIFFUSION FROM DOPED Pd" by B. Studer, Solid State Electronics, Vol. 23, pages 1181–1184, discloses that the barrier height of metal-semiconductor contacts can be varied within wide limits by a suitable doping (Sb,A1) of the metal layer itself and application of a temperature treatment to the sandwich structure. As a result, the doping elements are weakly diffused into the semiconductor surface. This leads to a change of the band bending and finally to a change of the barrier height. $Pd_2Si$/n-Si diodes with barrier heights $q \cdot \Phi_\beta$ between 0.5 and 0.8 eV were fabricated reproducibly by this method. The barrier height of undoped $Pd_2Si$/Si contacts equals 0.72 eV. The doping elements were introduced into the metal layer by partly covering the Pd-cathode of a DC-sputtering apparatus with A1 or Sb, and subsequent sputtering of the composite cathode onto the silicon slices.

The concentration of doping elements in the sputered metal layer is given by the relation of the part of the cathode surface covered with the doping element to the whole cathode surface.

The publication "Absence of Fermi Level pinning at metal-$In_xGa_{1-x}As$ (100) interfaces" by L. J. Brillson et al, Applied Physics Letters, V. 148, No. 21, May 26, 1986 at page 1458 discloses that soft x-ray photoemission spectroscopy measurements of clean, ordered $In_x$-$Ga_{1-x}As$ (100) surfaces with Au,In,Ge or A1 overlayers reveal an unpinned Fermi level across the entire In alloy series. The Fermi level stabilization energies depend strongly on the particular metal and differ dramatically from those of air-exposed interfaces. This wide range of Schottky barrier height for III-V compounds is best accounted for by a chemically induced modification in metal-alloy composition.

SUMMARY OF THE INVENTION

Metal-insulator-metal junctions have a wide variety of applications, both as devices, such as Josephson tunnel junctions, and as building blocks, for example as thermionic or tunneling emitters for hot electron transistors. In advanced applications, device size becomes quite small. Requirements for high current density, low voltage, and low capacitance make small barrier heights desirable. Barriers with virtually arbitrary heights and shapes are possible in single-crystal devices made from semiconductor heterostructures. However, single-crystal devices with true metal electrodes are not generally possible to fabricate. There is no general way to achieve barrier heights below $\simeq 100$ meV or to control barrier height and shape in metal-barrier-metal junctions. The structures of the present invention do not have this limitation.

This invention has to do with band edge engineering of polycrystalline barrier layers in junction devices. Composition and doping of multinary semiconductor layers sandwiched between two metal electrodes are adjusted so as to control the height and shape of barriers to the flow of majority carriers, or the electric fields experienced by minority carriers, in these polycrystalline devices. Barriers can be tailored by doping, for example, in single-crystal devices, but single crystals represent a very limited range of structures involving compatible (lattice-matched) materials. This invention allows a vastly broader class of device structures.

It is well-known that Schottky barrier heights at metal-compound semiconductor interfaces are typically determined by Fermi level pinning, and that the barrier height for a given semiconductor is virtually independent of what metal is used. There is considerable evidence that the same type of Fermi level pinning occurs at dislocations and grain boundaries. The present invention uses a multi-alloy semiconductor as the barrier material. The material is selected from a materials system in which the barrier height is a function of alloy composition.

An object of the present invention is to provide a method for fabricating metal-insulator-metal junction devices having barrier heights adjustable by the composition of the insulator layer.

Another object of the present invention is to provide a metal-multinary alloy metal junction device wherein the alloy composition determines the height and shape of the barriers in the structure.

A further object of the present invention is to provide a metal-polycrystalline alloy-metal structure wherein the polycrystalline alloy composition is selected t provide Fermi level pinning positions to achieve selected barrier heights and shapes.

DESCRIPTION OF THE PREFERRED EMBODIMENTS

In the following description, the terms "Fermi level" or "Fermi Energy", "Fermi level pinning" and "Fermi level pinning position" are used.

"Fermi level" or "Fermi Energy" is the upper energy bound for occupied states in a solid at T=0 (actually it is roughly halfway between the highest occupied state and the lowest unoccupied state, if it is located within a gap rather than within a band). In equilibrium, it is constant throughout the sample.

"Fermi level pinning" means that the Fermi level is forced to have a certain value at a surface or interface due to a high density of surface or interface states. The fact that the Fermi level is pinned at a surface at an energy different from its value in the bulk of the material implies band bending and surface charges.

The "Fermi level pinning position" is the value of the energy which the Fermi level has at the surface or interface.

It is known that Schottky barrier heights at metal/compound semiconductor interfaces are determined by a Fermi level pinning mechanism rather than by the electronic properties of the applied metallurgy. The present invention exploits the knowledge that the same type of Fermi level pinning occurs at semiconductor dislocations and grain boundaries. The present invention uses polycrystalline compound semiconductor alloys in which the pinning position is varied over a large range in metal/semiconductor structures. The structures are composed of sandwiches of metal, compound semiconductor and metal. Tunneling currents are determined by barrier height, controlled by semiconductor alloy composition, and semiconductor thickness. The energy barrier in the polycrystalline material can be uniform throughout, due to the uniformity of pinning position at both the metal/semiconductor interface and the grain boundaries.

According to the present invention, a method for fabricating junctions having metal electrodes separated by polycrystalline barriers with arbitrarily-chosen but controlled barrier height and shape is accomplished by varying the composition and doping of polycrystalline multinary compound semiconductor materials in the barrier, hence varying the Fermi level pinning position such that the Fermi level is fixed and controlled at and everywhere in between the two metal-insulator interfaces. This situation exists virtually independent of the doping. The basic structure is illustrated schematically in FIG. 1. The metal electrodes need not be single crystalline, and their crystal structures need have no particular relationship to that of the barrier. They can be normal metals or superconductors. The barrier consists of a compound semiconductor, and is, in general, polycrystalline in nature. In discussing the nature of a multigrain barrier layer in a junction such as that of FIG. 1, there are three relevant lengths to be considered. They are the grain size (d), the electrode spacing (t), and the Debye length ($L_D$) of the semiconductor barrier material. The use of Fermi level pinning at grain boundaries, as well as at the metal interfaces, is a novel feature of the present invention, therefore, the grain size is an important length scale that must be considered.

Figure 2:
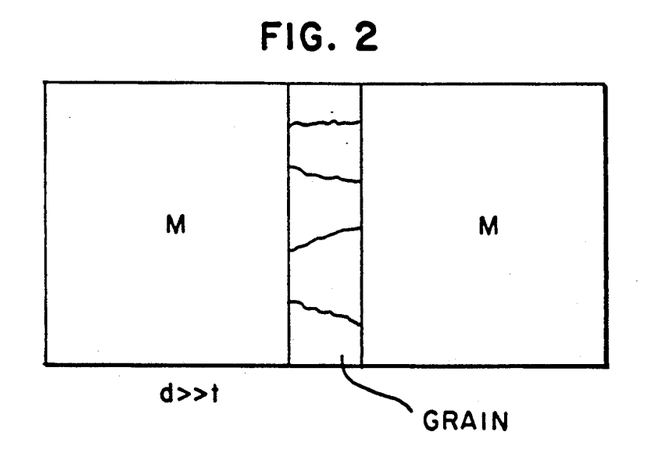
FIG. 2 is a schematic illustration of the structure of FIG. 1 wherein the grain size "d" is much greater than the electrode spacing "t".

The grain size can be small or large compared with the junction thickness (the spacing between the electrodes). In the first case, (d>>t) shown in FIG. 2, many grains exist within the barrier but typical carriers traverse the interelectrode space within a single grain. In the second case, (d<<t) shown in FIG. 3, a carrier encounters many grain boundaries in traversing the barrier. Typical values for grain size are 10nm $L_D$< infinity and electrode spacing (barrier thickness) is 2nm Lt<50nm.

Also, the grain size relative to the Debye length, $L_D$ is an important parameter. Debye length is the characteristic distance in a plasma beyond which the electric field of a charged particle is shielded by particles having charges of the opposite sign. Typical Debye length is in the range of 10nm<50nm. For small grains (d <<$L_D$), doping doesn't matter because the bands don't bend within a grain of fixed composition. The energy band profile of the device is determined by composition and by the grain boundaries and metal interfaces. For large grains (d>>$L_D$), doping is important. Doping and composition can be used alone or together to control the band shape within the grains. There is a vast parameter space for interesting structures, depending upon the relative values of D, t, and $L_D$ which are not known in the prior art.

Figure 3:
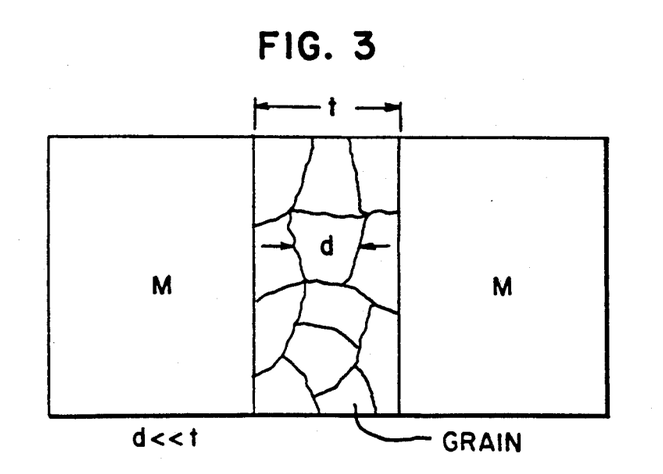
FIG. 3 is a schematic illustration of the structure of FIG. 1 wherein the grain size "d" is much smaller than the electrode spacing "t".
Figure 4:
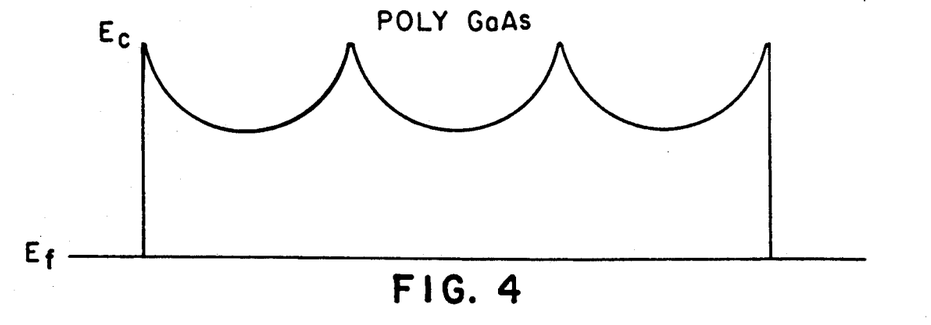
FIG. 4 is a schematic illustration of the relationship between the conduction band level and the Fermi level prior to an adjustment according to the present invention.
Figure 5:
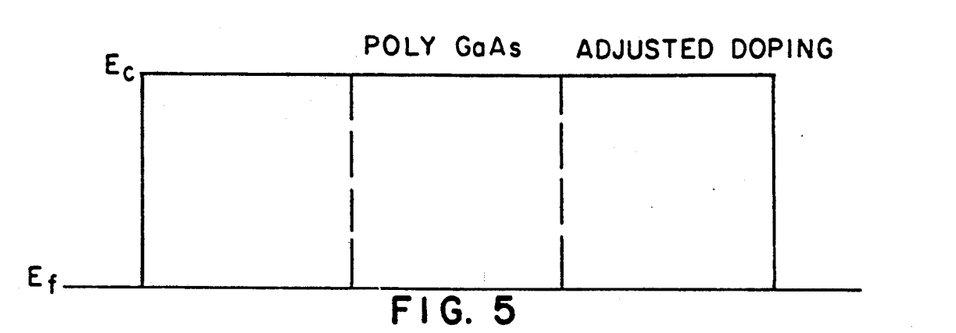
FIG. 5 is a schematic illustration of the relationship between the conduction band and the Fermi level where the doping level has been used to achieve a flat barrier according to the principles of the present invention.

As an example, FIG. 3 shows the situation that exists if polycrystalline GaAs is sandwiched between two metals. In this figure, t>>d. The doping level in the GaAs grains can be used to control the position of the band edge relative to the Fermi level. In the figure, the doping is used to adjust the value of $L_D$ and achieve a flat barrier as shown in FIG. 4. This is the simplest possible barrier shape achieved, and represents an almost trivial case of the possibilities illustrated by the other figures, most of which deal with spatially varying composition as well as doping.

Figure 1:
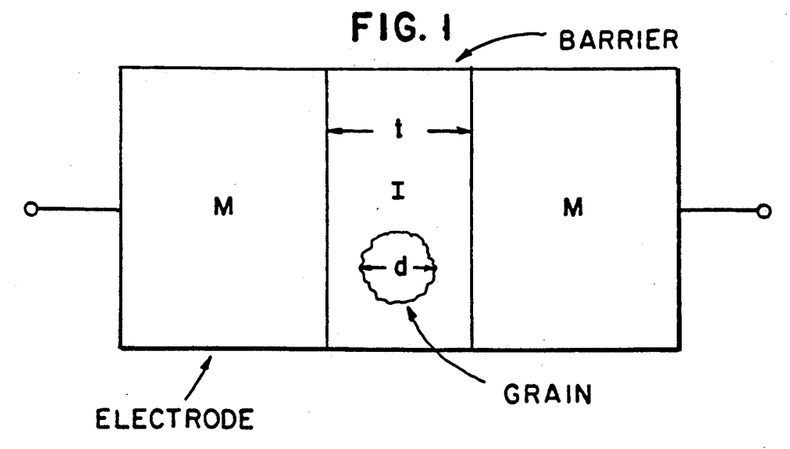
FIG. 1 is a schematic diagram of a metal-insulator-metal junction structure illustrating grain size "d" and electrode spacing "t".
Figure 6:
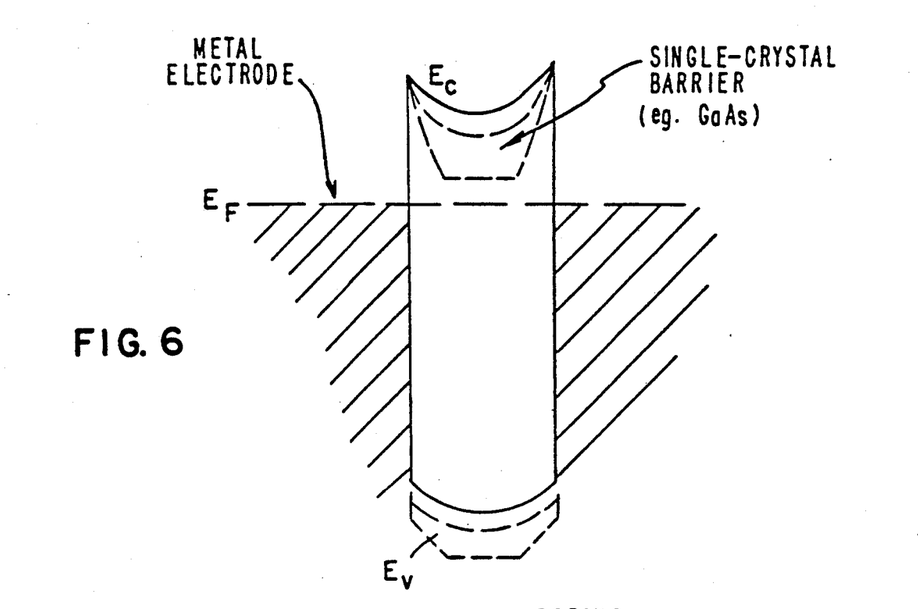
FIG. 6 is a schematic diagram of a metal-single crystal insulator-metal (or doped semiconductor) structure according to the prior art.

The structure of FIG. 1 stands in stark contrast to metal-single crystal structures, in which the Fermi level position can only be controlled by varying the doping in between the metal electrodes as shown in FIG. 6, a situation which is undesirable for many applications.

Metal-insulator-metal (MIM) junctions have a wide variety of applications. They can be used as devices directly, for example, as Josephson tunnel junctions or MIM diodes, and as building blocks, for example, as emitters (thermionic or tunneling) for hot electron transistors. For circuit or discrete high-frequency device applications, ultrasmall devices are of particular interest. In the past, MIM junctions were of the type in which the barrier height between the metal-insulator interfaces was uncontrolled, that is not amenable to engineering change. Therefore, charge transport properties, for example tunneling currents, were controlled by thickness of the insulator layer (in fact, this is the basis of present day Josephson junction technology). Present and future device and circuit requirements such as high current density, low voltage, and low capacitance make the ability to form small tailored barriers very important. Adjustability of barrier height allows the combination of barrier height and thickness to be optimized. It also allows turn-on voltage (in a thermionic emitter) to be controlled. The ability to tailor barrier shape extends the variety of potential devices, allowing, for example, asymmetric (rectifying) structures. Barriers with controlled heights and shapes over a limited range are possible in single-crystal devices made from semiconductor heterostructures. However, there is no way to tailor barrier heights and shapes in junctions with metal electrodes, in particular over the desired range 0 to 1 eV with a precision of 1 meV. This invention provides such a technique.

As previously discussed, it is known that Schottky barrier heights at most metal-compound semiconductor interfaces are determined by Fermi level pinning. Barrier heights for a given semiconductor are virtually independent of the metal electrode material. The same type of Fermi level pinning occurs at dislocations and grain boundaries. The present invention uses an alloy semiconductor as the barrier material. This material is selected from a materials system in which the metal-semiconductor barrier height is a function of alloy composition. One embodiment of the invention employs materials in which the barrier height passes through zero at some composition as shown in FIG. 3. For example, in $In_xGa_{1-x}As$ materials, the barrier height varies roughly linearly with x, from $\approx 0.7$ eV for x=0 and $-0.2$ eV for x=1. Such materials are ideal for devices dominated by electron (conduction band) transport. Alternatively, materials like InGaSb can be employed to achieve a small, controllable barrier for holes.

The junction disclosed in the present invention is more general than a MIM device. The present invention more generally employs a MSM (metal-semiconductor-metal) junction. Examples of specific device structures are described and shown in the drawings. The basic MSM device is formed by depositing metal, multinary (e.g., ternary) semiconductor, and second metal in sequence, the two metals being the device electrodes. The structure is a sandwich, as illustrated in FIG. 1. The metal electrodes are deposited by one of a variety of techniques, such as evaporation or sputtering. The barrier material can be deposited in a molecular beam epitaxy system, by chemical vapor deposition, or by other techniques normally employed for epitaxial growth (although epitaxy is not required for the structures described here). The composition of the semiconductor is be graded in order to control barrier shape. Due to the uniformity of the Fermi level pinning position at both the metal-semiconductor interface and at semiconductor grain boundaries, the barrier is homogeneous, appearing to first order like the barrier in a single-crystal semiconductor heterojunction tunnel structure with degenerate semiconductor electrodes. The present structure is, of course, much more generally useful. It is easily extended to multilayer (e.g., three terminal) structures.

The barrier shape can be intentionally controlled. The barrier height (which is a function of position in the direction normal to the plane of the junction) can be varied through the barrier. The local barrier height depends on the Fermi level pinning position at the metal-semiconductor interfaces and grain boundaries and on the local barrier composition. This invention uses the local composition to engineer the barrier shape. The barrier can be flat throughout the structure or the barrier can be shaped in order to obtain desirable properties. This is illustrated schematically in FIG. 4 for an unbiased junction In FIG. 4, $E_{B1}$ and $E_{B2}$ are the interfacial barrier heights and $E_c(x)$, which is determined by composition, is the local conduction band position relative to the Fermi level.

Figure 9A:
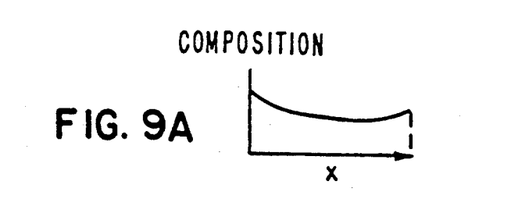
FIG. 9 is a schematic illustration of an example of a shaped barrier determined by barrier composition for an unbiased junction according to the principles of the present invention.
Figure 9B:
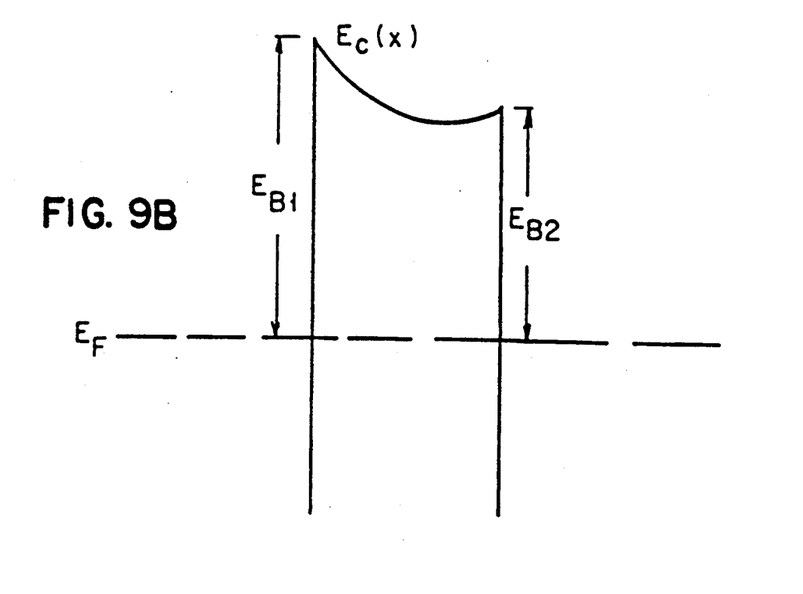

FIG. 9 is a generic tunnel junction in which the shape of the barrier potential is tailored by barrier composition. The barrier can be flat, trapezoidal, parabolic, etc., resulting in a current-voltage characteristic which is either symmetric or asymmetric. Barrier height and shape can be adjusted to optimize resistance and capacitance.

Figure 10:
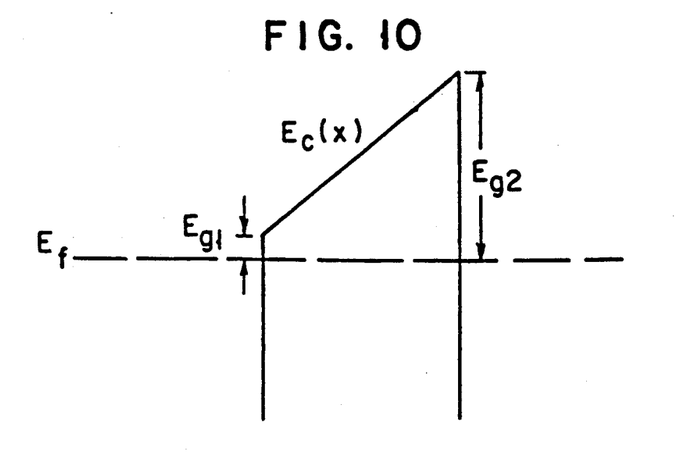
FIG. 10 is a schematic illustration of an example of a composition shaped barrier designed to be used with a junction employed as an undoped rectifier structure.

FIG. 10 illustrates an undoped rectifier structure. The device can be designed to be operated in the thermionic emission, thermionic field emission or field emission (tunneling) modes.

Figure 11:
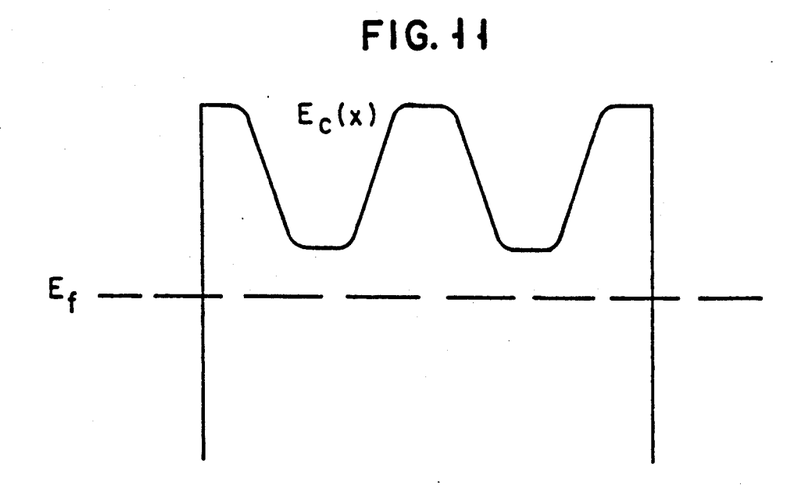
FIG. 11 is a schematic illustration of an example of a composition shaped barrier designed to be used with a junction employed as a quantum well device with a number of wells.

FIG. 11 illustrates a quantum well device. The number of wells, the well heights and well depth can be engineered by the technique described above.

Figure 7:
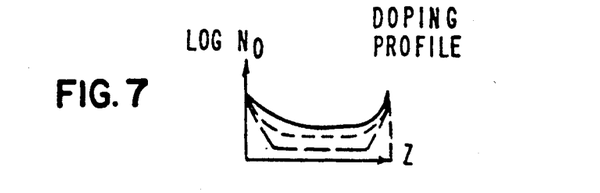
FIG. 7 is a schematic illustration of the doping profile for the structure of FIG. 6.
Figure 8:
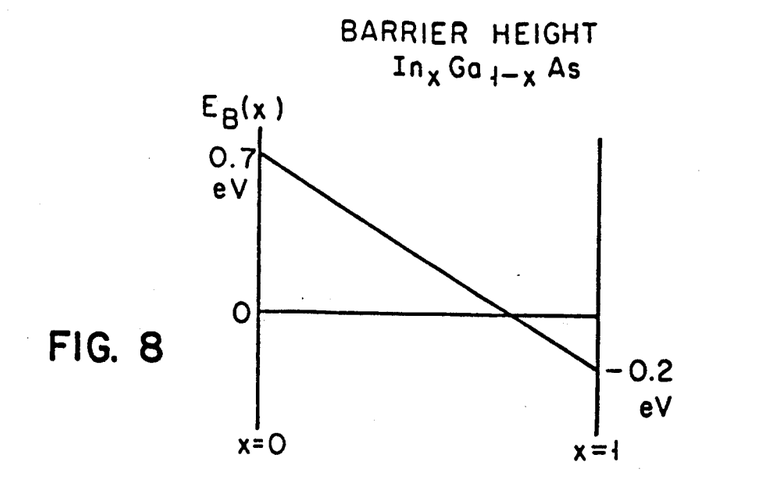
FIG. 8 is a schematic diagram of a waveform of a barrier height vs alloy composition for an alloy used in the present invention.
Figure 12:
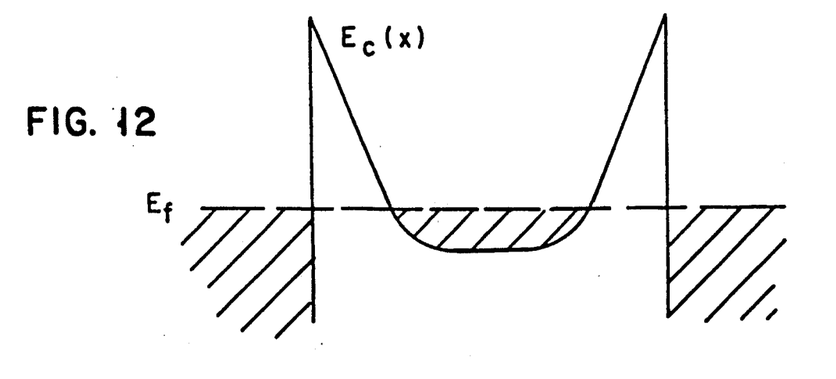
FIG. 12 is a schematic illustration of the waveform of the local conduction band position relative to the Fermi level of a metal-insulator-metal-insulator-metal structure in which the middle metal electrode is part of the semiconductor layer.

FIG. 12 illustrates an MIMIM device in which the middle electrode is part of the semiconductor layer. The structure of FIG. 7 can be used in a non-hysteretic Josephson junction.

Figure 13:
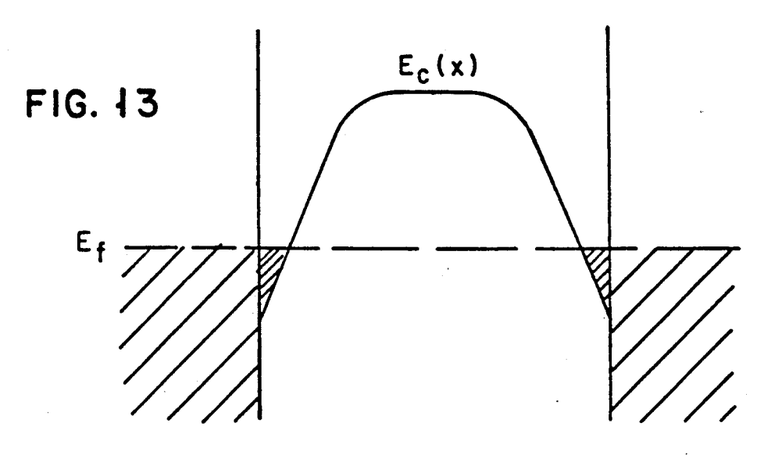
FIG. 13 is a schematic illustration of the waveform of the local conduction band position relative to the Fermi level of a metal-insulator-metal structure wherein the active electrode regions are within the semiconductor.

FIG. 13 illustrates a MIM device in which the active electrode regions are within the semiconductor.

Figure 14:
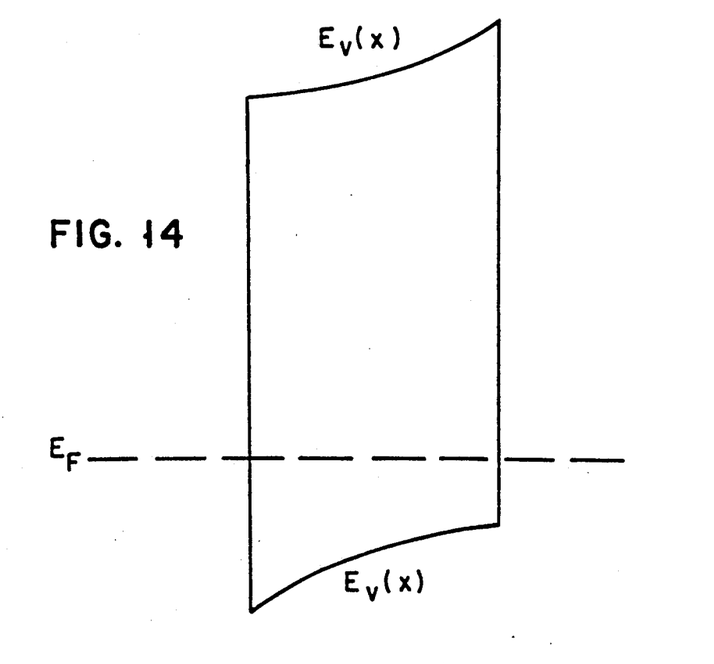
FIG. 14 is a schematic illustration of the waveform of the valence band equivalent for a hole transport version of the electron device represented by the waveform of FIG. 4.

The structures described by the curves in FIGS. 9 through 13 above are electron devices with transport dominated by the conduction band. Hole devices are also possible, as illustrated in FIG. 14, which represents the valence band equivalent of the structure of FIG. 9.

Specific compositions for the structures shown in FIGS. 9 through 13 are as follows.

FIG. 9. This is a general schematic. The structure could be achieved, for example, in the case $d \gg L_D$ ($d <$ or $> t$) by varying x from 0 to 0.3 in an undoped $In_xGa_{1-x}As$ barrier layer with a composition profile as sketched in the figure. $E_{B1}$ would be 0.7 eV and $E_{B2}$ would be ~0.4 eV.

FIG. 10. This structure could be achieved, for example, in the case $d \gg L_D$ by varying x from 0.5 to 0 in an $In_xGa_{1-x}As$ barrier layer with a linear composition profile. $E_{B1}$ would be ~0.1 eV and $E_{B2}$ would be 0.7 eV.

FIG. 11. This structure could be achieved, for example, in the case $d \gg L_D$ by varying x back and forth between 0 and 0.4 in an $In_xGa_{1-x}As$ barrier layer.

FIG. 12. This structure could be achieved, for example, in the case $d \gg t$ using pure polycrystalline GaAs and doping at $5 \times 10^{17}$ cm$^{-3}$. Alternatively, in the case $d \gg L_D$, with lightly-doped material, one can vary x from ~0 to ~1 and back.

FIG. 13. This structure could be achieved, for example, in the case $d \gg L_D$ by varying x from 1 to 0 and back in an $In_xGa_{1-x}As$ barrier layer.

These examples serve to illustrate the rich variety of device structures which are made possible by this invention, many of which are not otherwise possible at all. The possibilities go well beyond simple MIM diodes, as several of the examples show. These and related structures are easily generalized to three-terminal devices. Applications of this invention include, among others, tunnel junctions, hot electron transistors, superconducting base transistors and photodetectors.

Having thus described our invention, what we claim as new, and desire to secure by Letters Patent is:

1. A method for fabricating junctions composed of metal electrodes separated by a polycrystalline alloy barrier to form metal-insulator-metal junctions with selected barrier height and shape as a function of polycrystalline alloy composition comprising the steps of depositing a first metal electrode, depositing a selected graded multi alloy polycrystalline semiconductor barrier on said first metal electrode at a first interface, said semiconductor barrier multi alloy having a composition that is graded in the content of said separate alloys, and depositing a second metal electrode on said semiconductor at a second interface, wherein said grading of said semiconductor alloy composition is selected to provide selected Fermi level pinning positions at said metal-semiconductor interfaces and at the grain boundaries of said semiconductor, thereby providing selected barrier heights throughout said combination electrode, semiconductor and electrode structure resulting in barriers of selected shapes.

2. A method for fabricating junctions according to claim 1 wherein said graded multi alloy polycrystalline semiconductor barrier is graded at various values between said first and second electrode to form a junction structure having barrier heights that vary between said first and second electrodes to provide a desired shaped barrier.

3. A method according to claim 2 further including the step of doping said selected graded multi alloy polycrystalline semiconductor barrier with selected dopants.

4. A method according to claim 3 wherein said depositing of said graded alloy step and said doping of said graded alloy step function in combination to provide said shaped barrier.

5. A method according to claim 1 wherein said deposited multi alloy polycrystalline semiconductor barrier incorporates polycrystalline grains having grain size in the order of "d" diameter,
   wherein said first and second metal electrodes are deposited at said first and second interfaces separated apart by a distance "t".

6. A method according to claim 3 wherein the value of "d" is substantially greater than the value of "t".

7. A method according to claim 3 wherein the value of "d" is substantially less than the value of "t".

8. A method according to claim 3 wherein the Fermi level pinning position at said first and second interfaces and at the grain boundaries of said semiconductor are uniform to provide a homogeneous barrier.

* * * * *